US006026927A

United States Patent [19]

Burdett et al.

[11] Patent Number: 6,026,927

[45] Date of Patent: Feb. 22, 2000

[54] SPEAKER ASSEMBLY

[75] Inventors: Albert Burdett; Frank Sterns, both of Miami, Fla.; Doug Wright, Simi Valley, Calif.

[73] Assignee: Niles Audio Corporation, Inc., Miami, Fla.

[21] Appl. No.: 09/148,934

[22] Filed: Sep. 4, 1998

[51] Int. Cl.[7] ........................ H05K 5/00

[52] U.S. Cl. ........................ 181/144; 181/199

[58] Field of Search ........................ 181/141, 150, 181/153, 154, 163, 199, 144; 381/386, 389, 387

[56] References Cited

U.S. PATENT DOCUMENTS

| | | | |
|---|---|---|---|
| 3,976,838 | 8/1976 | Stallings, Jr. . | |
| 4,139,734 | 2/1979 | Finchman . | |
| 4,169,516 | 10/1979 | Honda | 181/199 |
| 4,182,429 | 1/1980 | Senzaki . | |
| 4,441,577 | 4/1984 | Kurihara . | |
| 4,445,228 | 4/1984 | Bruni . | |
| 4,553,630 | 11/1985 | Ando . | |
| 4,811,406 | 3/1989 | Kawachi . | |
| 4,884,655 | 12/1989 | Freadman et al. . | |
| 4,917,212 | 4/1990 | Iwaya . | |
| 5,133,428 | 7/1992 | Perrson . | |
| 5,319,164 | 6/1994 | Shen | 181/150 |
| 5,400,407 | 3/1995 | Cassity et al. . | |
| 5,402,502 | 3/1995 | Boothroyd et al. . | |

*Primary Examiner*—Khanh Dang
*Attorney, Agent, or Firm*—Lott & Friedland, PA

[57] ABSTRACT

A speaker assembly with a unique sound driver sub-baffle assembly which can be pivoted forward and backward, as well as rotated clockwise or counter-clockwise 360 degrees via the use of a rotatable turntable mounted within the speaker's baffle. The assembly allows a listener to manually alter the orientation and direction of the speaker's transducers thereby allowing for optimal dispersion control after the speaker is installed in a wall, regardless of the speaker's position within a room. The sub-baffle assembly, when pivoted to its maximum limit, provides a flush, continuous surface with the inner rim of the rotatable turntable, allowing a listener to control dispersion of the sound waves without creating distortion. Further, the transducers embedded within the sub-baffle assembly are maintained in a coplanar relationship throughout rotation and pivoting.

2 Claims, 7 Drawing Sheets

SPEAKER ASSEMBLY

TECHNICAL FIELD

This invention relates generally to a speaker assembly and in particular to a speaker assembly with a rotating turntable wherein is affixed a pivoting sub-baffle assembly comprised of at least one transducer embedded within the baffle of an audio speaker, thereby allowing a listener to easily pivot and rotate the transducers to easily target sound waves.

BACKGROUND OF THE INVENTION

The home audio industry places great emphasis on convenience and sound quality. In-wall audio speakers are at the height of their popularity. While floor speakers may, at times, provide comparable sound quality, the aesthetic appeal of in-wall speakers and their ability to deliver high-quality sound without the need to rearrange one's living room to make space for the speakers, have created a significant demand for quality in-wall speakers that deliver the hi-fidelity sound of floor speakers.

Unfortunately, once in-wall speakers are mounted in a wall, they cannot simply be turned to redirect the sound as can be done with floor speakers without a great deal of effort and expense. One possible solution to such a dilemma is to make the in-wall speaker movable, so that the sound emanating from the speaker can be redirected without repositioning the entire speaker assembly. Such speakers, however, face a number of inherent difficulties. For instance, a speaker designed to allow sound drivers to rotate may inhibit the sound emanating from the sound drivers, thereby causing diffraction of the sound waves. In particular, when the surface of the mount in which the speaker is embedded rotates, a portion of the mount protrudes from the surface of the baffle, while, naturally the opposing portion recedes within and below the surface of the baffle. Sound emanating from the sound driver is reflected by the inner "wall" created by the receding portion of the mount. This reflection causes diffraction of the sound waves resulting in lower quality of sound reproduction.

Another problem that arises when a speaker's sound components are rotated is that while one sound component can be rotated in one direction, the other components are either unable to be rotated, or are rotated separately, therefore resulting in the speaker's sound components being on different planes with one another. This results in sound waves arriving at its destination, the listener's ear, at different times, resulting in distortion. Therefore, although speakers may exist with a rotating sound driver component, these speakers do not take into account the difficulties created when only one sound driver is re-oriented without the ability to reorient any of the other sound drivers. Even if the other sound drivers could be adjusted, there would still be the likelihood of different planes as manual adjustments to each sound driver, separately, include inherent imperfections.

Previous attempts have been made to provide speakers with rotating components to direct sound for optimal listening such as are described in U.S. Pat. No. 5,402,502, to Boothroyd et al. (the '502 patent); U.S. Pat. No. 5,400,407, to Cassity et al. (the '407 patent); U.S. Pat. No. 5,133,428, to Perrson (the '428 patent); U.S. Pat. No. 4,917,212, to Iwaya (the '212 patent); U.S. Pat. No. 4,884,655, to Freadman et al. (the '655 patent); U.S. Pat. No. 4,811,406, to Kawachi (the '406 patent); U.S. Pat. No. 5,288,019, to Ando (the '019 patent); U.S. Pat. No. 4,553,630, to Ando (the '630 patent); U.S. Pat. No. 4,445,228, to Bruni (the '228 patent); U.S. Pat. No. 4,441,577, to Kurihara (the '577 patent); U.S. Pat. No. 4,139,734, to Fincham (the '734 patent); U. S. Pat. No. 4,182,429, to Senzaki. (the '429 patent); and U.S. Pat. No. 3,976,838 to Stallings, Jr., (the '838 patent), each of which is incorporated herein by reference.

The '502 patent describes a sound output system comprised of a baffle, a plurality of sound drivers, and a sound mirror. The sound mirror reflects a beam of sound from the sound driver horizontally and vertically while maintaining a generally consistent amplitude.

The '407 patent describes a tilt adjuster for a speaker which adjusts the position of a speaker recessed in a wall. The tilt-adjuster, preferably assembled with a speaker cover, is a wedge-shaped frame with an open central portion for receiving the speaker housing; a front side including a flattened perimeter for making abutting engagement with the speaker's housing; and a back side which attaches to the speaker's support frame.

The '428 patent shows a direction-adjustable speaker system comprised of a sound driver disposed within a rotatable mount positioned within a housing. The mount swivels within the housing to direct the sound to a desired location.

The '212 patent describes a speaker supporting unit which includes a base and a substantially disc-shaped spacer. The spacer includes a half-round groove through which a screw can be inserted to secure the spacer to the base. The first surface of the spacer, which determines the orientation of the speaker is determined by a combination of the inclined surface of the base and the second surface of the spacer, which is varied by the relative angle between the base and the spacer.

The '655 patent describes a speaker cabinet having a pair of front wall segments adjacent to the ends of the cabinet, an intermediate forwardly opening cavity extending between the upper and lower front wall segments, a pair of large subwoofer speakers in the upper and lower front wall segments, and a swiveled movable center subcabinet having a woofer, mid-range speaker and a pair of tweeters. The subcabinet has a range of swivel movement horizontally about a vertical axis.

The '406 patent describes a compound speaker system comprising a woofer, a squawker, a tweeter, and a super tweeter. The squawker, tweeter and super tweeter are attached to a plate and this assembly is rotatably positioned within the cone of the woofer. The system can be designed where the tweeter and super tweeter are at an elevated position with respect to the squawker when the assembly is rotated within the cone of the woofer.

The '630 patent describes a speaker with a tweeter angle adjusting device. The tweeter can change direction by use of horizontal and vertical adjusting knobs and which are secured to horizontal shaft and vertical shafts, respectively, through the use of interlocking mechanisms.

The '228 patent shows a stereo audio system for a motorcycle including a housing for a radio receiver and speaker-mirror assemblies, mounted on base-socket assemblies, and threaded over mounting posts screwed into holes in the handlebars.

The '577 patent describes a direction-variable speaker system for car-audio devices comprising two speaker cases containing speaker units for different reproduction bands, and an intermediate case interposed between the two speaker cases. A first pivotal shaft and a rising angle setting mechanism connect the first speaker case with the intermediate case. Between the second speaker case and the intermediate case is a second pivotal shaft as well as a twisting angle setting mechanism. By using the rising angle and twisting angle mechanisms, both speaker cases can be varied with respect to their angles in rising amount and twisting amount.

The '734 patent describes a pivoting loudspeaker with a plurality of enclosures, wherein at least one of the enclosures is pivotably mounted with respect to another of the enclosures, and a light emitting device which is visible through an aperture only when a listener is in correct listening position.

The '429 patent shows a loud-speaker system particularly suitable for use in car stereo systems, comprising at least a tweeter, with a woofer arranged coaxially to the tweeter wherein the tweeter is adjustably mounted to the woofer in order to allow manual regulation of the position of the tweeter to that of the woofer.

The '838 patent describes a sound reproduction system comprised of a plurality of speakers, said system being mounted in a wall.

None of the devices described in the foregoing patents overcome the inherent problems associated with rotatable speaker components. In particular, the device of the '428 patent comprises means to rotate only the tweeter component, which creates a "wall" inhibiting the sound from the rotating sound driver. The device of the '212 patent describes a speaker support unit which utilizes an angled spacer inserted between the base of the unit and the speaker to determine the orientation of the speaker. There is no rotating or pivoting mechanism. The devices of the '406 and '429 patents each provide for a swiveling "dish" which both create a "wall" to diffract the sound, and neither comprises a rotating turntable to allow for 360 degrees of clockwise or counter-clockwise rotation. Finally, the device of the '630 patent provides horizontal and vertical adjusting knobs to rotate the tweeter only, thereby creating a non-coplanar relationship between the tweeter and other components. The device of the '630 patent also lacks a rotating turntable, thereby inhibiting the tweeter's range of motion.

None of the devices mentioned above describe a speaker assembly with a pivoting sub-baffle assembly comprising at least one transducer wherein the orientation of the transducers can be adjusted via rotating or pivoting means to target sound.

Consequently, there is a need in the art for a speaker assembly with a pivoting sub-baffle assembly comprising one or more transducers which can be pivoted forward and backward to direct the sound without creating a protruding wall which may cause diffraction of the sound.

There is a further need in the art to provide a speaker assembly that maintains the transducers in a coplanar relationship while they are pivoted.

There is yet a further need in the art for a speaker assembly comprising a rotatable turntable containing one or more transducers which can be rotated clockwise or counterclockwise to allow a listener to easily provide for more diverse targeting of sound.

SUMMARY OF THE INVENTION

The present invention solves significant problems in the art by providing a speaker assembly capable of being rotated and pivoted so as to enable a listener to redirect sound transmissions without obstructing same. Generally described, the speaker assembly comprises a baffle including a front surface and a rear surface, a rotatable turntable having an outer surface and affixed to the baffle, a sub-baffle assembly comprising a sub-baffle pivotally mounted to the turntable and capable of receiving at least one transducer, and a means to provide coplanar relationship between each transducer such that the sound radiating from each transducer is optimal without diffraction and distortion, whereby the sub-baffle assembly is positioned such that sound radiating from each transducer is not obstructed by the outer surface of the rotatable turntable when the sub-baffle is pivoted about its horizontal axis.

In the preferred embodiment of the present invention, the rotatable turntable is affixed to the baffle via spring tension.

Thus, it is an object of the present invention to provide a speaker assembly comprising a baffle including a front surface and a rear surface, a rotatable turntable having an outer surface and affixed to the baffle; and a sub-baffle assembly comprising a sub-baffle pivotally mounted to the turntable and capable of receiving at least one transducer.

It is a further object of the present invention to provide a means to provide coplanar relationship between each transducer such that the sound radiating from the transducers is optimal without diffraction and distortion.

It is a further object of the present invention to position the sub-baffle assembly such that sound radiating from the transducer is not obstructed by the outer surface of the rotatable turntable when the sub-baffle is pivoted.

It is a further object of the present invention to affix the rotatable turntable to the baffle via spring tension.

These and other objects, features, and advantages of the present invention may be better understood and appreciated from the following detailed description of the embodiments thereof, selected for purposes of illustration and shown in the accompanying drawings.

DETAILED DESCRIPTION OF THE PREFERRED EMBODIMENT

Figure 1:
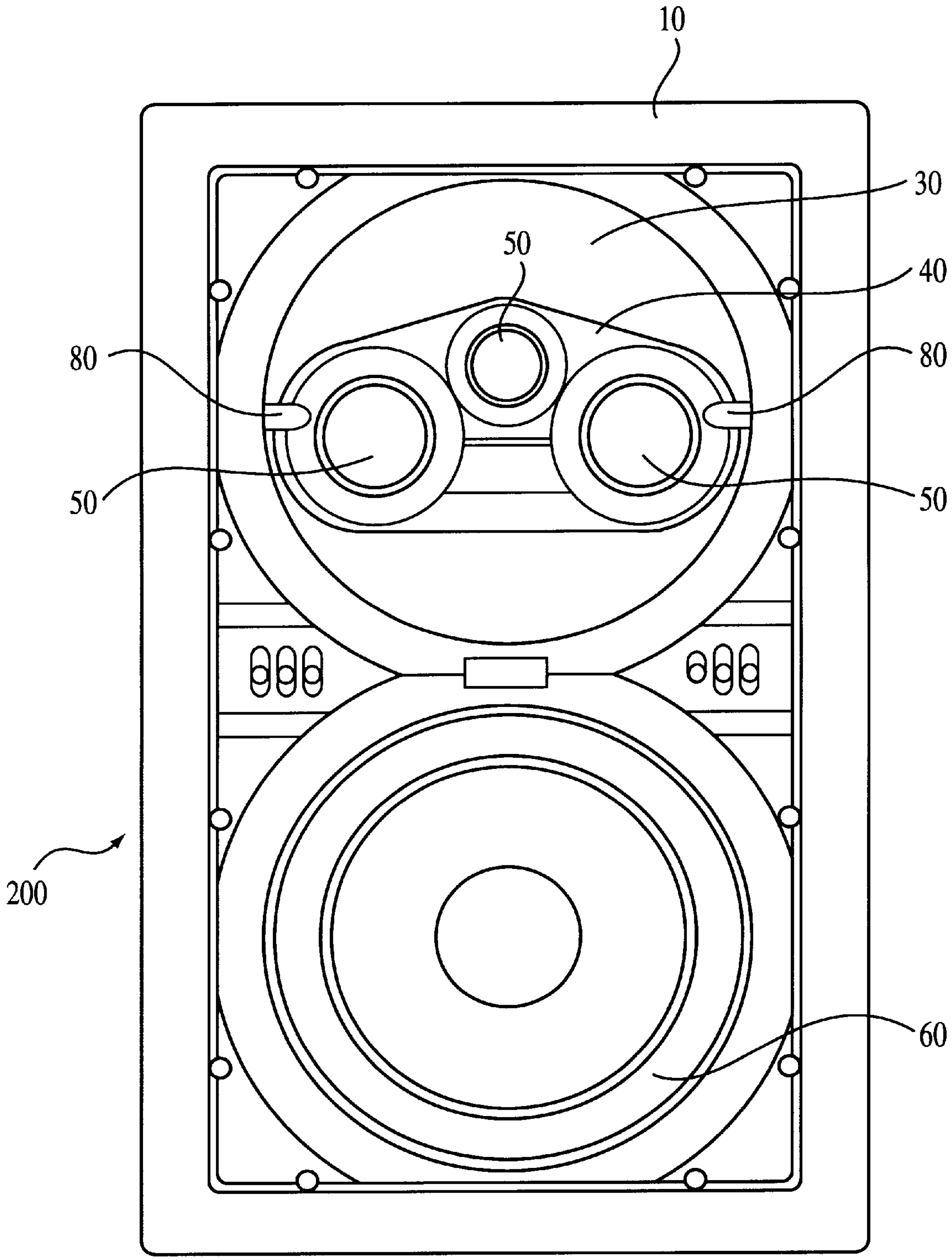
FIG. 1 is a front view of a baffle having a low-frequency transducer and a pivoting sub-baffle assembly with transducers therein within a rotatable turntable.

Referring initially to FIG. 1 of the drawings, in which like numerals indicate like elements throughout the several views, in a preferred embodiment the speaker assembly of this invention is generally illustrated by reference numeral 200 and is generally comprised of a baffle 10, a circular casing 20, a rotatable turntable 30, and a sub-baffle assembly 40 capable of receiving at least one transducer 50. FIG. 1 depicts a preferred embodiment showing the baffle 10, rotatable turntable 30, and sub-baffle assembly 40 receiving three transducers 50. The baffle 10 is comprised of reinforced plastic. The baffle 10 defines a plurality of cavities. In the preferred embodiment, within one of the cavities is the low-frequency transducer, known as a woofer 60. The woofer 60 is comprised of an eight inch aluminum/titanium/urethane or aluminum/urethane cone with a cast aluminum frame. However, other materials are available. A protective covering comprised of a custom construction debris screen fits over the exposed rear portion of the woofer 60.

Affixed to the rear surface of the baffle 10, and positioned immediately below one of the cavities is a circular casing 20. The casing 20 is secured beneath the baffle 1 by standard fastening means such as a plurality of screws. The casing 20 is comprised of plastic and is situated directly beneath the cavity.

Also affixed to the rear surface of the baffle 10 and within the casing 20 is a rotatable turntable 30 having a downward-sloping, concave outer surface 70 which faces outwards toward the listener. The bottom surface of the turntable 30 extends downward beneath the baffle 10 and into the interior of the casing 20. A gasket may be affixed to the outer circumference of the rotatable turntable 30 to allow for smooth rotation of the rotatable turntable 30 within the casing 20. The gasket is comprised of Teflon or other suitable material. The rotatable turntable 30 can rotate in either direction by either manual or remote means. A pair of mounting grooves 90 are situated on the outer rim of the rotatable turntable 30. The grooves 90 are to receive opposing posts 80 located on each end of the sub-baffle assembly 40. Within the sloping, concave outer surface 70 of the rotatable turntable 30 is a space defined by an inner rim 110, which is capable of receiving the sub-baffle assembly 40. This can be seen in FIG. 3. A key design feature of the rotatable turntable 30 is its sloping, concave outer surface 70, and inner rim 110. It is within this inner rim 110 that the sub-baffle assembly 40 containing the transducers 50 is situated.

Figure 2:
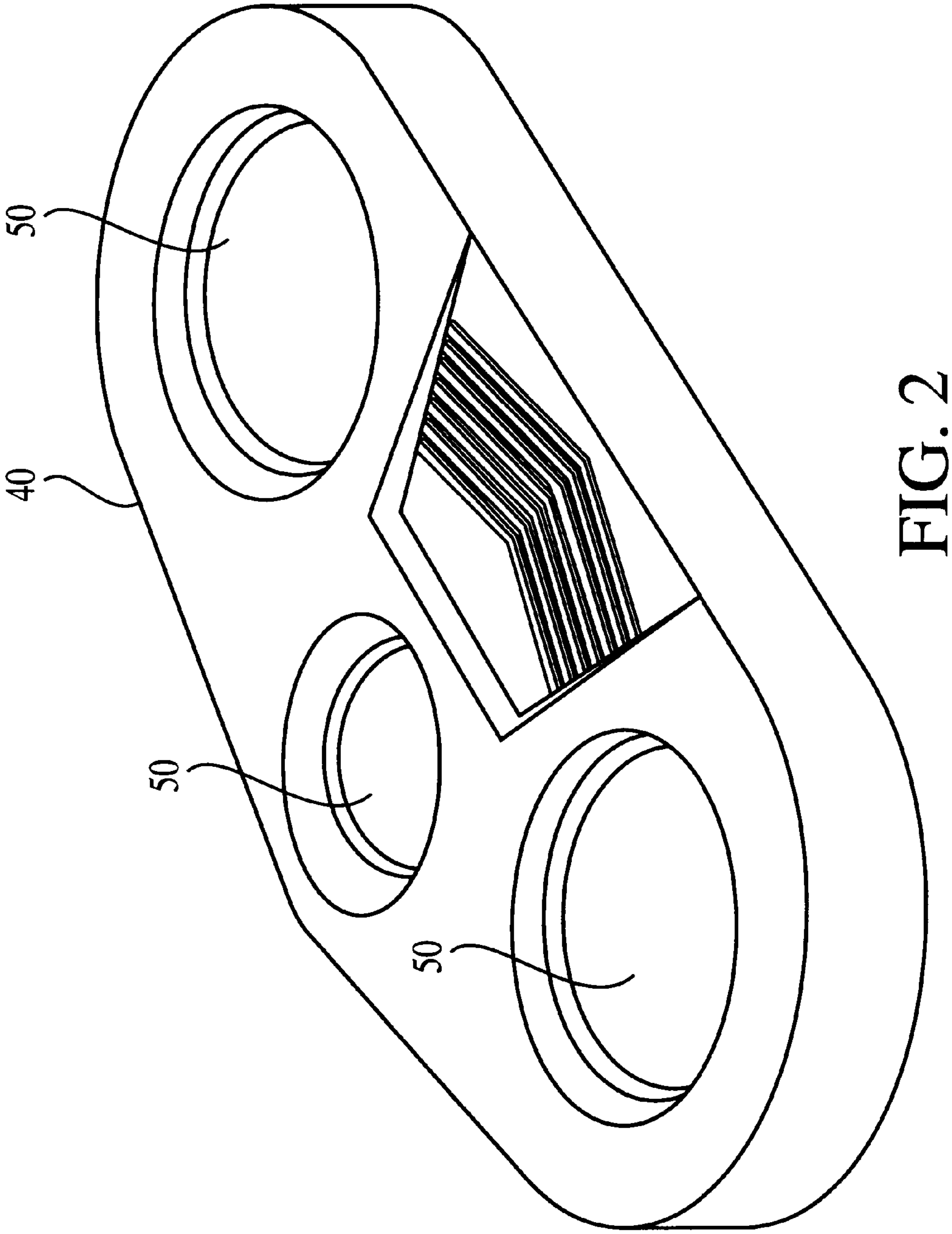
FIG. 2 is a perspective view of the pivoting sub-baffle assembly.
Figure 3:
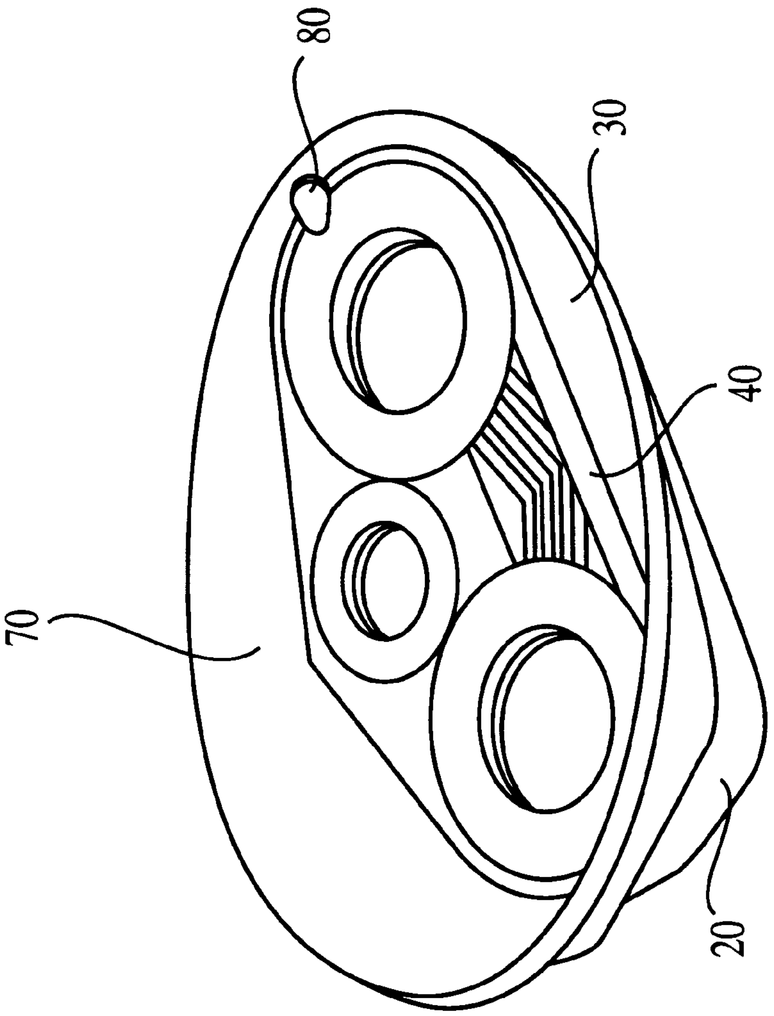
FIG. 3 is a perspective view of the rotatable turntable, circular casing and sub-baffle assembly situated therein.
Figure 4:
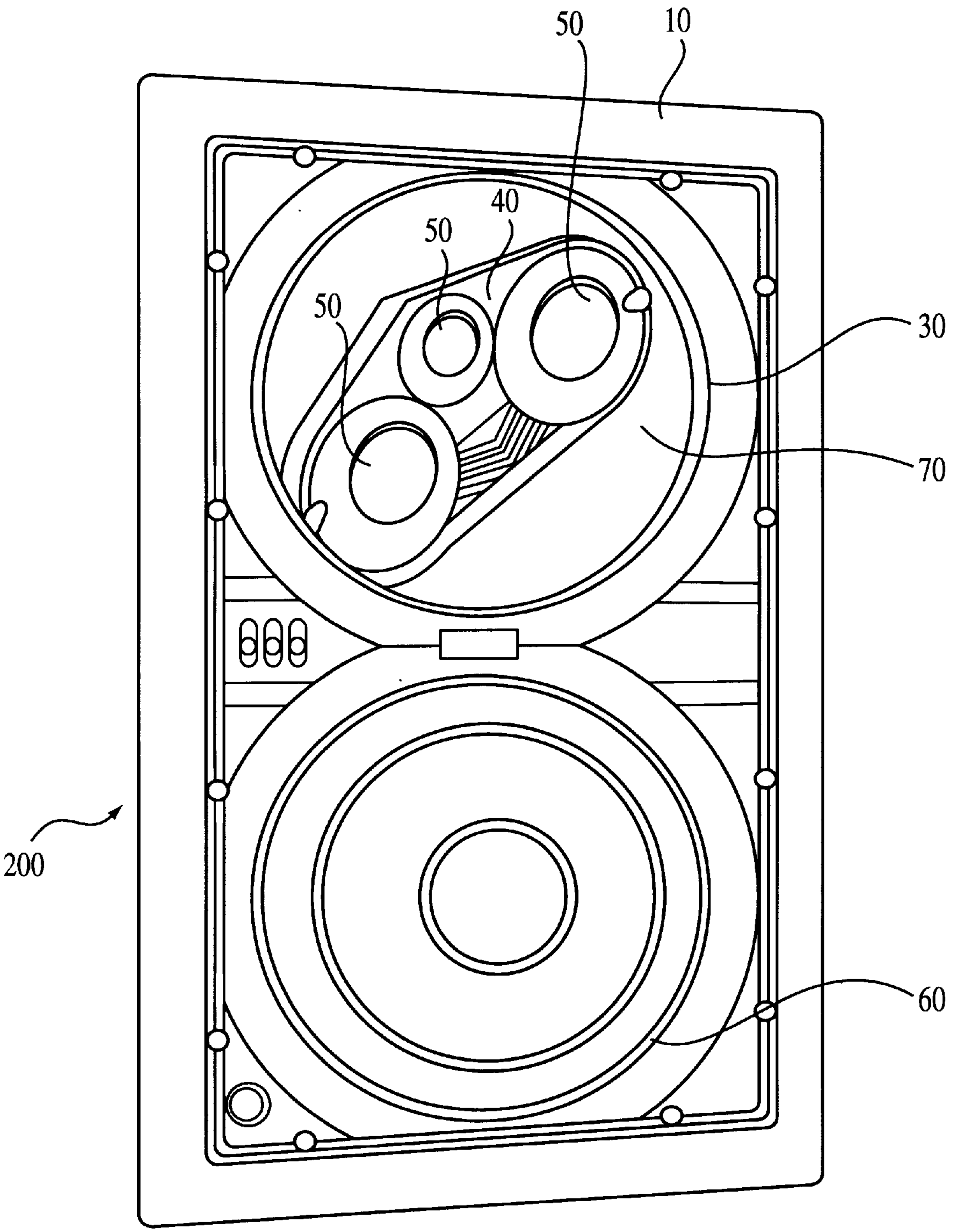
FIG. 4 is a perspective view of a baffle with sub-baffle assembly and transducers situated within the rotatable turntable.
Figure 5:
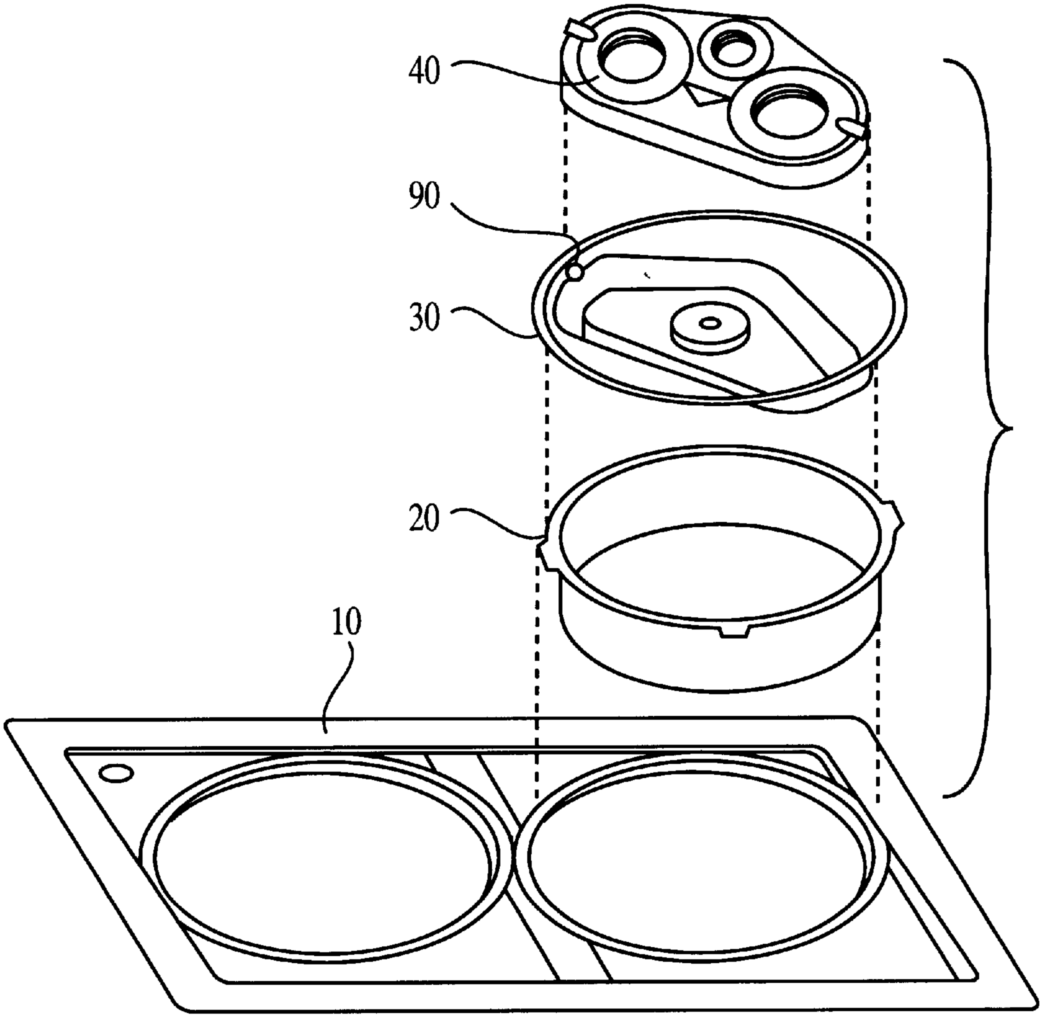
FIG. 5 is an exploded view of the preferred embodiment including the baffle, circular casing, rotatable turntable, and sub-baffle assembly.
Figure 6:
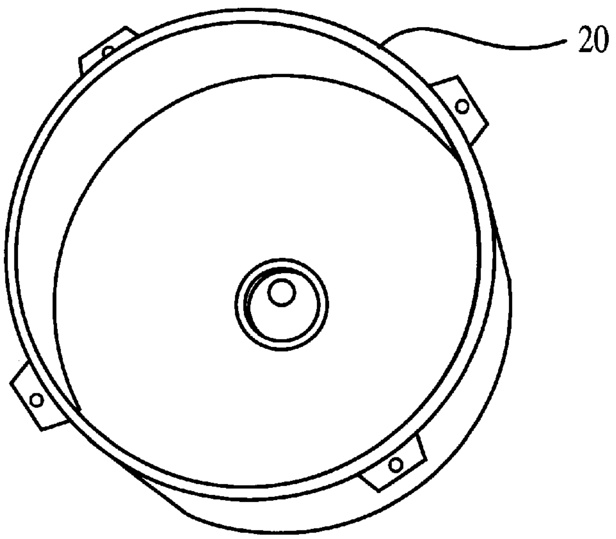
FIG. 6 is a front view of the circular casing.
Figure 7:
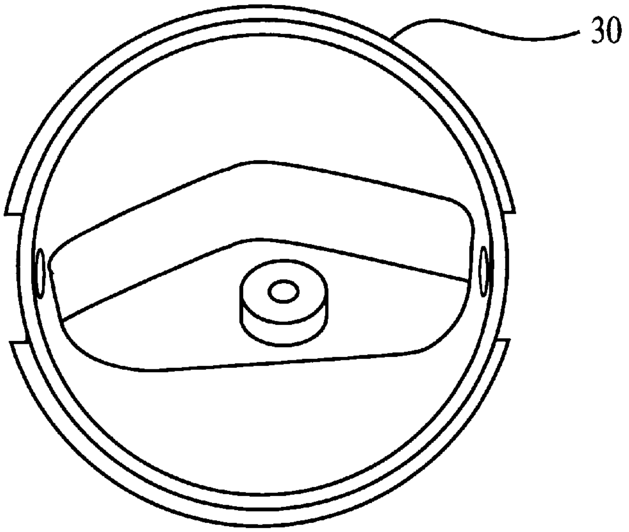
FIG. 7 is a front view of the rotatable turntable.
Figure 8:
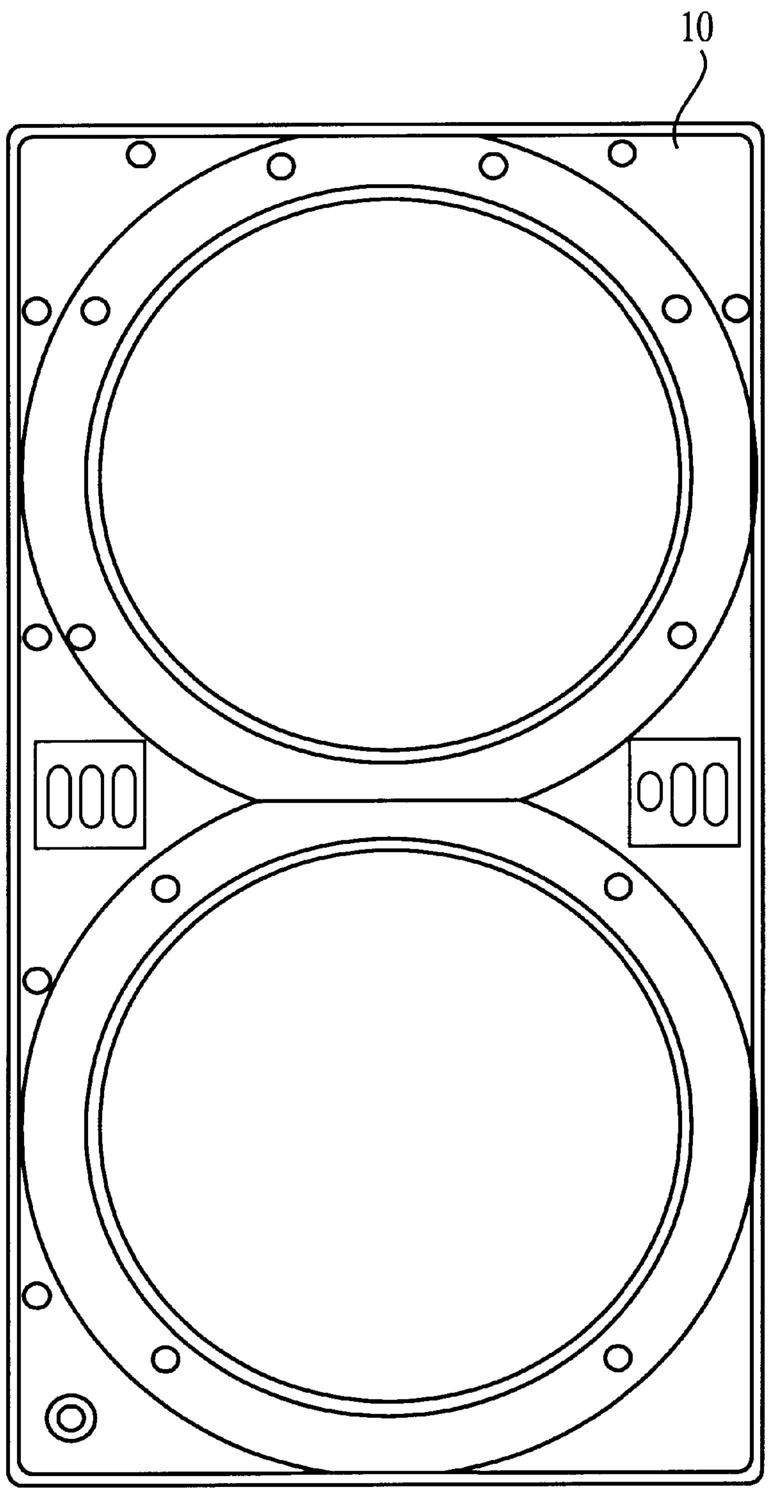
FIG. 8 is a front view of the baffle without any components inserted.

The sub-baffle assembly 40 resides within the concave, outer surface 70 of the rotatable turntable 30, as shown in FIG. 3. The sub-baffle assembly 40, comprised of plastic, or a plastic-like material, contains at least one transducer 50. The sub-baffle assembly 40 can be seen clearly in FIG. 2. The sub-baffle assembly 40 is generally longitudinal in shape, and must be of sufficient dimensions to fit within the rotatable turntable 30. The transducers 50 that are embedded within the sub-baffle assembly 40 usually comprise two mid-range sound drivers and one high-frequency sound driver, although other configurations are possible. In the preferred embodiment, the transducers 50 are arranged within the sub-baffle assembly 40 in a unique DSFG™ (Directed Sound Field Geometry) configuration. This configuration places the high-frequency transducer, or tweeter, above and between the two mid-range frequency transducers, in a triangular fashion. The high-range frequency transducer 50 is comprised of a one inch fluid-cooled aluminum/titanium/urethane, or aluminum/urethane hyperbolic dome. However, other materials are available. A protective covering may also be placed over the transducer 50 to protect it. The mid-range transducers are two one-and-a-half inch aluminum/titanium/urethane or aluminum/urethane hyperbolic domes, although other materials are available. There is also an optional protective covering similar to that protecting the high-range frequency transducer. Located at each end of the sub-baffle assembly 40 are two retaining posts 80. The posts 80 are small protrusions extending from each end of the sub-baffle assembly 40. When the sub-baffle assembly 40 is mounted within the rotatable turntable 30 via the posts 80 of the sub-baffle assembly 40 and the mounting grooves 90 of the rotatable turntable 30, a listener may easily adjust the orientation of the transducers 50 in a variety of ways.

The transducers 50 can be pivoted both forwards and backwards. In the preferred embodiment, the sub-baffle assembly 40 is pivoted to a limiting point approximately fifteen degrees forwards or fifteen degrees backwards, although this may vary depending upon design choices. The longitudinal edges of the sub-baffle assembly 40 are prevented from dropping below the plane of the inner rim 110 of the top, concave, outer surface 70 of the rotatable turntable 30 when the sub-baffle assembly 40 is pivoted forwards or backwards. This is critical, because sound waves will normally reflect off the sharp '"edge" of the inner rim 110 when any portion of the sub-baffle assembly 40 drops below the inner rim 110 of the rotatable turntable 30, thereby causing diffraction and distortion of sound. The leading edge (that is, the edge receding towards the inner rim 110 when the sub-baffle assembly 40 is pivoted) of the sub-baffle assembly 40, in conjunction with the sloping, outer surface 70 of the rotatable turntable 30 creates a smooth, continuous surface. Because of the smooth interface between the leading edge of the sub-baffle assembly 40 and the inner rim 110 of the concave outer surface 70 of the rotatable turntable 30, there is no obstructing sharp "edge" formed. It is the interfacing of the unique sloping design of the rotatable turntable 30 and the leading edge of the sub-baffle assembly 40 that eliminates the diffraction of the sound waves from the transducers 50 against the edge of the inner rim 110 of the rotatable turntable 30.

Because all of the transducers 50 are pivoted together, they maintain a coplanar relationship with each other. This is critical, because if one transducer 50 were to be pivoted in one direction and the other transducers pivoted in another direction, or not pivoted at all, distortion will occur due to the different lengths the sound waves must travel before reaching the listener's ear. By maintaining all of the transducers 50 in one plane during pivoting, the listener can adjust the transducers 50 to a chosen position to achieve optimal clarity without diffraction or distortion.

The sub-baffle assembly 40 containing the transducers 50 can also be rotated clockwise or counter clockwise to further direct the sound. A listener can easily rotate the sub-baffle assembly 40 and rotatable turntable 30 by grasping the sub-baffle assembly 40 via its longitudinal edges and rotating it in either direction until the listener is satisfied with the sound. In an alternate embodiment, a remote controller can transmit signals to a receiver embedded within the speaker assembly to control both the pivoting and rotating of the transducers 50. In yet another embodiment, the rotatable turntable 70 and sub-baffle assembly 40 arrangement can be utilized as a free-standing model, without the restrictions of an inner rim. In all embodiments, the listener has the ability to both pivot and rotate the speaker's transducers, thereby creating a unique arrangement of sound components to allow for easy directing of sound.

Accordingly, it will be understood that the preferred embodiment of the present invention has been disclosed by way of example and that other modifications and alterations may occur to those skilled in the art without departing from the scope and spirit of the appended claims.

We claim:

1. A speaker assembly comprising:

a baffle including a front surface and a rear surface;

a rotatable turntable having an outer surface and affixed to said baffle;

a sub-baffle assembly comprising a sub-baffle pivotally mounted to said turntable and capable of receiving at least one transducer; and a means to provide coplanar relationship between each transducer such that the sound radiating from said transducers is optimal without diffraction and distortion, whereby said sub-baffle assembly is positioned such that sound radiating from each transducer is not obstructed by said outer surface of said rotatable turntable when said sub-baffle is pivoted about its horizontal axis.

2. The speaker assembly of claim 1, wherein said rotatable turntable is affixed to said baffle via spring tension.

* * * * *